United States Patent
Lin et al.

(10) Patent No.: US 9,653,099 B2
(45) Date of Patent: May 16, 2017

(54) INFORMATION STORAGE APPARATUS AND METHOD

(71) Applicant: Huawei Technologies Co., Ltd., Shenzhen (CN)

(72) Inventors: Yinyin Lin, Shanghai (CN); Yarong Fu, Shanghai (CN); Kai Yang, Shanghai (CN); Wei Yang, Hangzhou (CN); Yuangang Wang, Shenzhen (CN); Junfeng Zhao, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/078,594

(22) Filed: Mar. 23, 2016

(65) Prior Publication Data

US 2016/0203835 A1    Jul. 14, 2016

Related U.S. Application Data

(63) Continuation of application No. PCT/CN2014/087272, filed on Sep. 24, 2014.

(30) Foreign Application Priority Data

Sep. 24, 2013   (CN) .......................... 2013 1 0440053

(51) Int. Cl.
*G11B 5/00*    (2006.01)
*G11C 11/02*   (2006.01)
(Continued)

(52) U.S. Cl.
CPC .................. *G11B 5/09* (2013.01); *G11B 5/02* (2013.01); *G11C 11/02* (2013.01); *G11C 11/15* (2013.01);
(Continued)

(58) Field of Classification Search
CPC . G11C 19/0841; G11C 19/0808; G11C 11/14; G11C 11/15; G11C 11/02;
(Continued)

(56) References Cited

U.S. PATENT DOCUMENTS 6,834,005 B1 * 12/2004 Parkin ..................... G11C 11/14
                                                    365/80
7,551,469 B1    6/2009 Parkin
(Continued)

FOREIGN PATENT DOCUMENTS

| CN | 101299347 A | 11/2008 |
| CN | 101770803 A | 7/2010 |
| CN | 102044255 A | 5/2011 |

OTHER PUBLICATIONS

Extended European Search Report issued in European Patent Application No. 14 84 7885, mailed Sep. 12, 2016, 7 pages.
(Continued)

*Primary Examiner* — Thang Tran
(74) *Attorney, Agent, or Firm* — Quarles & Brady LLP

(57) ABSTRACT

An information storage apparatus includes a magnetic track, a writer, and a reader, where the magnetic track includes a number of magnetic domains. Each magnetic domain is divided into at least two magnetic regions, and the writer is disposed on the magnetic track, and configured to write information to the at least two magnetic regions of each magnetic domain. The reader, disposed on the magnetic track, is configured to read the written information from the at least two magnetic regions. Therefore, multiple pieces of valid information are written to one magnetic domain of the magnetic track, thereby increasing storage density of the magnetic track, and expanding a storage capacity of the storage apparatus.

14 Claims, 4 Drawing Sheets

(51) Int. Cl.
*G11B 5/09* (2006.01)
*G11B 5/02* (2006.01)
*G11C 11/15* (2006.01)
*G11C 11/56* (2006.01)
*G11C 19/08* (2006.01)

(52) U.S. Cl.
CPC ...... *G11C 11/5607* (2013.01); *G11C 19/0808* (2013.01); *G11C 19/0841* (2013.01); *G11B 2005/0002* (2013.01)

(58) Field of Classification Search
CPC ........ G11C 11/5607; G11B 2005/0002; G11B 5/02; G11B 5/09; G11B 5/3903; G11B 5/012; G11B 5/64
See application file for complete search history.

(56) References Cited

U.S. PATENT DOCUMENTS

| | | |
|---|---|---|
| 7,667,994 B1 | 2/2010 | Moriya et al. |
| 2004/0252539 A1 | 12/2004 | Parkin |
| 2005/0078509 A1* | 4/2005 | Parkin ..................... G11C 11/15 365/158 |
| 2008/0138661 A1 | 6/2008 | Lim et al. |
| 2010/0080034 A1* | 4/2010 | Hung .................. G11C 19/0841 365/80 |
| 2010/0135059 A1* | 6/2010 | Pi ....................... G11C 19/0841 365/80 |
| 2010/0172169 A1 | 7/2010 | Lee et al. |
| 2011/0085258 A1* | 4/2011 | Bae ........................ B82Y 25/00 360/31 |

OTHER PUBLICATIONS

International Search Report issued in PCT Application No. PCT/CN2014/087272 mailed Dec. 24, 2014, 12 pages.
Parkin et al. "Magnetic Domain-Wall Racetrack Memory" Science Magazine, Apr. 11, 2008, 7 pages.
Ishigaki, T. et al. "A Multi-Level- Cell Spin-Transfer Torque Memory with Series-Stacked Magnetotunnel Junctions" IEEE 2010 Symposium on VLSI Technology Digest of Technical Papers, 2 pages.

* cited by examiner

INFORMATION STORAGE APPARATUS AND METHOD

CROSS-REFERENCE TO RELATED APPLICATIONS

This application is a continuation of International Application No. PCT/CN2014/087272, filed on Sep. 24, 2014, which claims priority to Chinese Patent Application No. 201310440053.0, filed on Sep. 24, 2013, both of which are hereby incorporated by reference in their entireties.

TECHNICAL FIELD

The present disclosure relates to the field of electronic technologies, and in particular, to an information storage apparatus and method.

BACKGROUND

Recent years have seen a growing quantity of researches on a data storage apparatus that stores data by means of a movement of a magnetic domain wall. A micromagnetic region that forms a magnet may be referred to as a magnetic domain, and directions of magnetic moments as a result of an electron spin may be basically the same in the magnetic domain. A size and magnetic polarization of the magnetic domain can be properly controlled using a shape and a size of a magnetic material and external energy. A magnetic domain wall may refer to a boundary region between magnetic domains that have different magnetic polarization, and the magnetic domain wall can be moved by applying a magnetic field or a current to the magnetic material.

FIG. 1 shows a schematic structural diagram of a nano-magnetic track storage apparatus in the prior art. In FIG. 1, the apparatus includes a magnetic track 101, a writing unit 102, and a reading unit 103, where the magnetic track 101 includes multiple magnetic domains 104 and magnetic domain walls (not shown in the figure) between the magnetic domains. When an impulse current is applied to the magnetic track 101, the magnetic domain walls between the magnetic domains 104 are moved, and a movement of the magnetic domain walls causes a movement of the magnetic domains 104. In this case, the magnetic domains 104 move in an opposite direction of the impulse current. In a process of the movement of the magnetic domains 104, the writing unit 102 disposed on the magnetic track 101 applies a magnetic field to the magnetic domains 104. Under impact of the external magnetic field, an original magnetic field direction of the magnetic domains 104 rotates, and in this case, "0" or "1" can be recorded in the magnetic domains 104.

After information writing is completed, under impact of the impulse current, the magnetic domains 104 to which information is already written are moved to a position of the reading unit 103. The reading unit 103 is a magnetoresistive sensor, and the reading unit 103 includes a free layer and a pinning layer, where the pinning layer has a fixed magnetic field direction, and a direction of the free layer changes under impact of the external magnetic field. The free layer is relatively close to the magnetic track 101, and when the magnetic domains 104 pass by the reading unit 103, the magnetic field direction of the free layer changes under impact of a magnetic field in the magnetic domains 104. When the magnetic field direction of the free layer is consistent with the magnetic field direction of the pinning layer, the magnetoresistive sensor presents a low resistance state, and information read by the reading unit 103 in this case is "0". When the magnetic field direction of the free layer is opposite to the magnetic field direction of the pinning layer, the magnetoresistive sensor presents a high resistance state, and information read by the reading unit 103 in this case is "1". In this way, a process of writing information to and reading information from the magnetic track 101 is completed.

However, each magnetic domain 104 of the magnetic track 101 in the prior art can only store 1-bit information: "0" or "1", causing low information storage density of the magnetic track.

SUMMARY

Embodiments of the present disclosure provide an information storage apparatus and method, intended for resolving a problem in the prior art of low storage density of an information storage apparatus that uses a magnetic domain wall movement.

Specific technical solutions are as follows.

According to a first aspect, an embodiment of the present disclosure provides an information storage apparatus, including a magnetic track, where the magnetic track consists of multiple magnetic domains, and each magnetic domain is divided into at least two magnetic regions, a writing unit, disposed on the magnetic track, where information is written by the writing unit to the at least two magnetic regions of each magnetic domain, and a reading unit, disposed on the magnetic track, where the information written to the at least two magnetic regions of each magnetic domain is read by the reading unit.

With reference to the first aspect, in a first possible implementation manner, all magnetic regions in the at least two magnetic regions of each magnetic domain have a same magnetic field direction.

With reference to the first aspect, in a second possible implementation manner, all magnetic regions in the at least two magnetic regions of each magnetic domain are made of materials with different magnetization thresholds, where the magnetization threshold is minimum external magnetic field strength for changing a magnetic field direction of a magnetic region.

With reference to the second possible implementation manner, in a third possible implementation manner, the writing unit generates a first induced magnetic field $P_1$ and changes a magnetic field direction of a first magnetic region in the at least two magnetic regions using the first induced magnetic field in order to write information to the first magnetic region, where $P_1$ is greater than a magnetization threshold $K_1$ of the first magnetic region, or the writing unit generates a second induced magnetic field $P_2$ and changes a magnetic field direction of a first magnetic region and a second magnetic region in the at least two magnetic regions using the second induced magnetic field in order to write information to the first magnetic region and the second magnetic region, where $P_2$ is greater than a magnetization threshold $K_2$ of the second magnetic region, or the writing unit successively generates a second induced magnetic field $P_2$ and a first induced magnetic field $P_1$, changes a magnetic field direction of a first magnetic region and a second magnetic region in the at least two magnetic regions using the second induced magnetic field in order to write information that is to be written to the second magnetic region to the second magnetic region, and changes the magnetic field direction of the first magnetic region again using the first induced magnetic field in order to write information that is to be written to the first magnetic region to the first magnetic region, where $P_2>P_1$.

With reference to the first aspect, in a fourth possible implementation manner, the writing unit includes at least two writing components, a first writing component in the at least two writing components is disposed on a surface of a first magnetic region in the at least two magnetic regions, and a second writing component in the at least two writing components is disposed on a surface of a second magnetic region in the at least two magnetic regions; and information is written by the first writing component to the first magnetic region, and information is written by the second writing component to the second magnetic region.

With reference to the first aspect, in a fifth possible implementation manner, the reading unit includes at least two reading components, a first reading component in the at least two reading components is disposed on a surface of a first magnetic region in the at least two magnetic regions, and a second reading component in the at least two reading components is disposed on a surface of a second magnetic region in the at least two magnetic regions, and information written to the first magnetic region is read by the first reading component, and information written to the second magnetic region is read by the second reading component.

With reference to the first aspect, in a sixth possible implementation manner, the apparatus further includes a drive unit, which is connected to the magnetic track and inputs an impulse current to the magnetic track to drive each magnetic region in the at least two magnetic regions of the magnetic domain to move in a same direction.

According to a second aspect, an embodiment of the present disclosure provides an information storage method, including, when a predetermined impulse current is detected, moving each magnetic domain that is on a magnetic track and includes at least two magnetic regions to a position corresponding to a writing unit, writing, by the writing unit, information to the at least two magnetic regions, and reading, by the reading unit, the information written to the at least two magnetic regions.

With reference to the second aspect, in a first possible implementation manner, all magnetic regions in the at least two magnetic regions have different magnetization thresholds, where the magnetization threshold is minimum external magnetic field strength for changing a magnetic field direction of a magnetic region.

With reference to the first possible implementation manner, in a second possible implementation manner, the writing, by the writing unit, information to the at least two magnetic regions includes changing a magnetic field direction of a first magnetic region in the at least two magnetic regions using a first induced magnetic field generated by the writing unit in order to write information to the first magnetic region, where magnetic field strength of the first induced magnetic field is greater than a magnetization threshold of the first magnetic region, or changing a magnetic field direction of a first magnetic region and a second magnetic region in the at least two magnetic regions using a second induced magnetic field generated by the writing unit in order to write information to the first magnetic region and the second magnetic region, where magnetic field strength of the second induced magnetic field is greater than a magnetization threshold of the first magnetic region and the second magnetic region, or successively generating, by the writing unit, a second induced magnetic field and a first induced magnetic field, changing a magnetic field direction of a first magnetic region and a second magnetic region using the second induced magnetic field in order to write information that is to be written to the second magnetic region to the second magnetic region, and changing the magnetic field direction of the first magnetic region again using the first induced magnetic field in order to write information that is to be written to the first magnetic region to the first magnetic region.

With reference to the second aspect, in a third possible implementation manner, the reading, by the reading unit, the information written to the at least two magnetic regions includes reading, by a first reading component in the reading unit, information written to a first magnetic region in the at least two magnetic regions, and reading, by a second reading component in the reading unit, information written to a second magnetic region in the at least two magnetic regions.

The embodiments of the present disclosure provide the information storage apparatus and method, and the apparatus includes a magnetic track, where the magnetic track includes multiple magnetic domains, and each magnetic domain is divided into at least two magnetic regions a writing unit, disposed on the magnetic track, where information is written by the writing unit to the magnetic domain that includes the at least two magnetic regions; and a reading unit, disposed on the magnetic track, where the information written to the at least two magnetic regions of each magnetic domain is read by the reading unit, that is, at least 2-bit information can be stored on the magnetic track in the embodiments of the present disclosure. Therefore, multiple pieces of valid information are written to one magnetic domain of the magnetic track, which increases storage density of the magnetic track, and expands a storage capacity of the storage apparatus.

Further, the writing unit of the information storage apparatus in the embodiments of the present disclosure can adjust an induced magnetic field generated by the writing unit in order to write different information to a divided magnetic region using a changed induced magnetic field, thereby implementing efficient storage of different information.

BRIEF DESCRIPTION OF DRAWINGS

To describe the technical solutions in the embodiments of the present disclosure more clearly, the following briefly introduces the accompanying drawings required for describing the embodiments or the prior art. The accompanying drawings in the following description show merely some embodiments of the present disclosure, and a person of ordinary skill in the art may still derive other drawings from these accompanying drawings without creative efforts.

DESCRIPTION OF EMBODIMENTS

The following clearly describes the technical solutions in the embodiments of the present disclosure with reference to the accompanying drawings in the embodiments of the present disclosure. The described embodiments are some but not all of the embodiments of the present disclosure. All other embodiments obtained by a person of ordinary skill in the art based on the embodiments of the present disclosure without creative efforts shall fall within the protection scope of the present disclosure.

Embodiment 1

An embodiment of the present disclosure provides an information storage apparatus, including a magnetic track, where the magnetic track consists of multiple magnetic domains, a magnetic domain wall (not shown in the figure) is included between each two magnetic domains, and each magnetic domain is divided into at least two magnetic regions, a writing unit, where the writing unit is disposed on the magnetic track, and information is written to the at least two magnetic regions of each magnetic domain by the writing unit, and a reading unit, disposed on the magnetic track, where the information written to the at least two magnetic regions of each magnetic domain is read by the reading unit.

Figure 1:
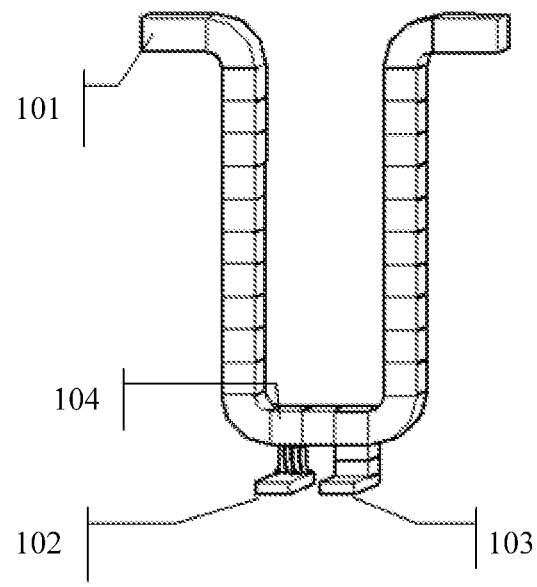
FIG. 1 is a schematic structural diagram of a magnetic track storage apparatus in the prior art.
Figure 2:
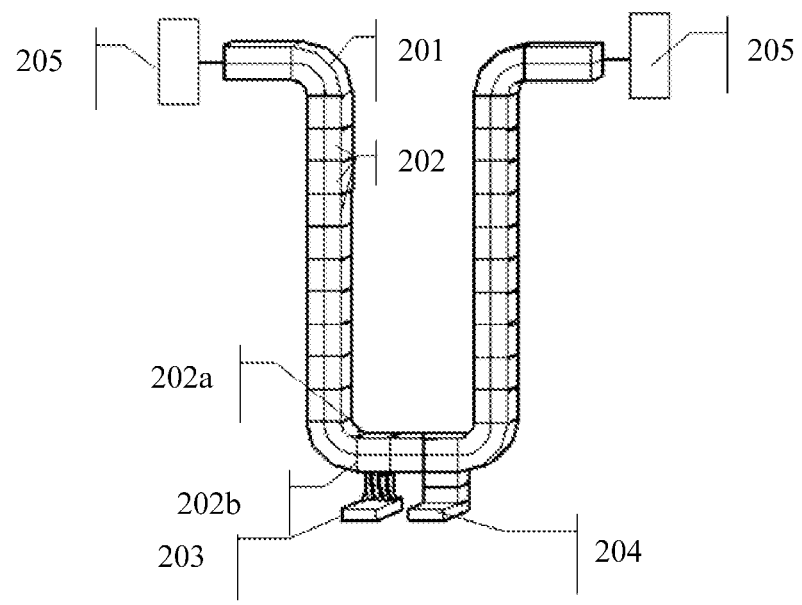
FIG. 2 is a schematic structural diagram of an information storage apparatus according to an embodiment of the present disclosure.

In the following embodiment, the technical solution of the present disclosure is described first using an example in which a magnetic domain is divided into two magnetic regions, that is, as shown in FIG. 2, each magnetic domain 202 in FIG. 2 includes a first magnetic region 202a and a second magnetic region 202b.

Furthermore, a magnetic track 201 in this embodiment of the present disclosure may be in multiple types of structures, for example, may be in a cylinder structure, an elliptical cylinder structure, or a cuboid structure. In this embodiment of the present disclosure, the magnetic track 201 uses a cuboid structure, and certainly, the magnetic track 201 may be linear or U-shaped, or may be another similar or workable shape and structure. In FIG. 2, a U-shaped cuboid structure is used for description of this embodiment of the present disclosure, and such a structure can increase information storage density of the magnetic track 201.

On the basis of the structure of the foregoing magnetic track 201, in this embodiment of the present disclosure, the magnetic domain 202 is divided into two magnetic parts, namely, the first magnetic region 202a and the second magnetic region 202b. The first magnetic region 202a and the second magnetic region 202b are located in an upper part and a lower part of the magnetic domain 202 respectively. The two magnetic regions may be identical in shape and size, and certainly may also be different in shape and size, which can be adjusted according to a structure requirement. In this embodiment of the present disclosure, the first magnetic region 202a is roughly identical to the second magnetic region 202b in shape and size. Therefore, the first magnetic region 202a and the second magnetic region 202b overlap to form the magnetic domain 202 in FIG. 2, where the first magnetic region 202a and the second magnetic region 202b do not affect a magnetic field direction of each other.

It should be noted that the first magnetic region 202a and the second magnetic region 202b of the magnetic track 201 are magnetic regions made of different materials, that is, the first magnetic region 202a and the second magnetic region 202b are made of materials with different magnetization thresholds, where the magnetization threshold is minimum external magnetic field strength for changing a magnetic field direction of a magnetic region, where the magnetization threshold herein may be a magnetic anisotropy constant or may be an equivalent parameter.

Because information read by a reading unit 204 is directly related to a magnetic field direction of the magnetic domain 202, information can be written to the magnetic domain 202 only by changing the magnetic field direction of the magnetic domain 202. Therefore, in this embodiment of the present disclosure, a magnetic field direction of the first magnetic region 202a and/or the second magnetic region 202b can be affected only using different external magnetic field strength such that same or different information is written to the first magnetic region 202a and/or 202b in this manner. For example, when "0" or "1" is written to the first magnetic region 202a and "0" or "1" is written to the second magnetic region 202b, the magnetic domain 202 stores two significant bits, that is, "00", "01", "10", or "11".

In this embodiment of the present disclosure, the first magnetic region 202a and the second magnetic region 202b have different magnetization thresholds. Therefore, different induced magnetic fields may be generated using a writing unit 203 in order to write information to the first magnetic region 202a and the second magnetic region 202b. A specific information writing manner is as follows.

First of all, a prerequisite for information writing is to move the magnetic domain to a position corresponding to the writing unit 203. In this embodiment of the present disclosure, a drive unit 205 connected to the magnetic track 201 applies a predetermined and qualified impulse current to the magnetic track 201. Under an action of the impulse current, a magnetic domain wall (not shown in the figure) between the magnetic domain 202 and a neighboring magnetic domain 202 performs an unpinning movement, and the movement of the magnetic domain wall causes a movement of the magnetic domain. Using the drive unit 205, the magnetic domain 202 to which information is to be written can be moved to the position corresponding to the writing unit 203.

First, it should be noted that a magnetization threshold $K_1$ of the first magnetic region 202a is less than a magnetization threshold $K_2$ of the second magnetic region 202b. When the magnetic field directions of the first magnetic region 202a and the second magnetic region 202b are not changed, a significant bit recorded in the first magnetic region 202a is "0", and a significant bit recorded in the second magnetic region 202b is also "0", that is, significant bits recorded in the magnetic domain are "00" in an initial state, and certainly, the initial state may also be defined as "01". In addition, the magnetic field direction of the first magnetic region 202a may be the same as or may be different from that of the second magnetic region 202b. To make the information writing faster and more convenient, in this embodiment of the present disclosure, in the initial state, the significant bits recorded in the magnetic domain are "00", and the magnetic field direction of the first magnetic region 202a is consistent with that of the second magnetic region 202b.

The writing unit 203 is disposed on a surface of the first magnetic region 202a. When the writing unit 203 needs to write "10" to the magnetic domain 202, the writing unit 203 generates a first induced magnetic field $P_1$ and changes the magnetic field direction of the first magnetic region 202a using the first induced magnetic field $P_1$ in order to write information to the first magnetic region 202a, where $K_1<P_1<K_2$.

That is, the first induced magnetic field generated by the writing unit 203 affects only the magnetic field direction of the first magnetic region 202a, and does not affect the magnetic field direction of the second magnetic region 202b. In this case, a significant bit recorded in the first magnetic region 202a is "1", and a significant bit recorded in the second magnetic region 202b is "0". Then, two significant bits recorded in the magnetic domain 202 are "10", and in this way, the writing unit 203 implements writing of the significant bits "10".

When the writing unit 203 needs to write "11" to the magnetic domain 202, the writing unit 203 generates a second induced magnetic field $P_2$ and changes the magnetic field directions of the first magnetic region 202a and the second magnetic region 202b using the second induced magnetic field $P_2$ in order to write information to the first magnetic region 202a and the second magnetic region 202b, where $P_2>K_2>K_1$.

That is, the second induced magnetic field generated by the writing unit 203 affects the magnetic field directions of both the first magnetic region 202a and the second magnetic region 202b. Because the magnetic field directions of both the first magnetic region 202a and the second magnetic field direction 202b are changed, a significant bit "1" is recorded in both the first magnetic region 202a and the second magnetic region 202b, and two significant bits recorded in the magnetic domain 202 are "11". In this way, writing of information "11" to the magnetic domain 202 is completed.

When the writing unit 203 needs to write "01" to the magnetic domain 202, the writing unit 203 successively generates the second induced magnetic field $P_2$ and the first induced magnetic region $P_1$. First, the magnetic field direction of both the first magnetic region 202a and the second magnetic region 202b is changed using the second induced magnetic field, and in this case, a significant bit "1" is written to both the first magnetic region 202a and the second magnetic region 202b. However, it is not expected to write information "11" herein. Therefore, the writing unit 203 may further generate the first induced magnetic field. Under impact of the first induced magnetic field, the magnetic field direction of the first magnetic region 202a is changed again, and in this case, a significant bit written to the first magnetic domain 202a is "0". In this way, the writing unit 203 completes writing of the significant bits "01" to the magnetic domain 202. Therefore, a magnetic field direction of a magnetic region can be changed randomly using a changeable induced magnetic field of the writing unit 203 such that information to be written is written to the magnetic region.

Certainly, an induced magnetic field generated by the writing unit 203 needs to be determined according to a magnetization threshold of a magnetic region, that is, the induced magnetic field generated by the writing unit 203 varies with a material of the magnetic region.

Figure 3:
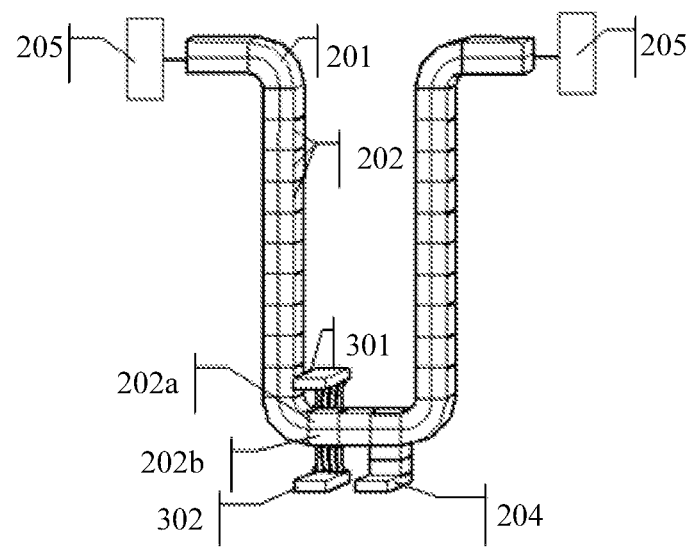
FIG. 3 is a schematic structural diagram of another information storage apparatus according to an embodiment of the present disclosure.

In addition to the foregoing information writing manner, in this embodiment of the present disclosure, the writing unit 203 may further include a first writing component 301 and a second writing component 302 (as shown in FIG. 3). The first writing component 301 is disposed on a surface of the first magnetic region 202a, and the second writing component 302 is disposed on a surface of the second magnetic region 202b. Information is written by the first writing component 301 to the first magnetic region 202a, and information is written by the second writing component 302 to the second magnetic region 202b. A specific information writing manner is as follows.

First, it should be noted that an induced magnetic field generated by the first writing component 301 changes only the magnetic field direction of the first magnetic region 202a and does not change the magnetic field direction of the second magnetic region 202b, and certainly, an induced magnetic field generated by the second writing component 302 also changes only the magnetic field direction of the second magnetic region 202b and does not change the magnetic field direction of the first magnetic region 202a. Specific implementation of mutual isolation between magnetic fields of the first writing component 301 and the second writing component 302 may be adding an isolation layer made of a particular material between the first magnetic region 202a and the second magnetic region 202b such that the magnetic fields generated by the first writing component 301 and the second writing component 302 can be isolated.

Based on the foregoing principle, when "00" needs to be written to the magnetic domain 202, neither the first writing component 301 nor the second writing component 302 generates an induced magnetic field. In this case, significant bits written to the magnetic domain 202 are "00".

When "01" needs to be written to the magnetic domain 202, the first writing component 301 generates an induced magnetic field and changes the magnetic field direction of the first magnetic region 202a using the induced magnetic field, and in this case, the second writing component 302 does not generate an induced magnetic field. In this case, writing of the significant bits "01" is completed.

When "10" needs to be written to the magnetic domain 202, the first writing component 301 does not generate an induced magnetic field, and in this case, the second writing component 302 generates an induced magnetic field and changes the magnetic field direction of the second magnetic region 202b using the induced magnetic field. In this case, writing of the significant bits "10" is completed.

When "11" needs to be written to the magnetic domain 202, the first writing component 301 generates an induced magnetic field and changes the magnetic field direction of the first magnetic region 202a using the induced magnetic field, and in this case, the second writing component 302 also generates an induced magnetic field and changes the magnetic field direction of the second magnetic region 202b. In this case, writing of the significant bits "11" is completed.

In an embodiment in which the first writing component 301 and the second writing component 302 exist, a magnetic field in one writing component affects only one magnetic region. Therefore, the magnetization threshold of the first magnetic region 202a may be the same as or different from that of the second magnetic region 202b.

After the writing unit 203 writes information to the magnetic domain 202, the drive unit 205 in the information storage apparatus continues to drive the magnetic domain 202 in the magnetic track 201 to move to a position at which the reading unit 204 is located, and the reading unit 204 determines, according to the magnetic field directions of the first magnetic region 202a and the second magnetic region 202b in the magnetic domain 202, information that is written to the first magnetic region 202a and the second magnetic region 202b.

Furthermore, the reading unit 204 may be a magnetic tunnel junction magnetoresistive component (magnetoresistive sensor), and a reading principle of the reading unit 204 is as follows.

Figure 4:
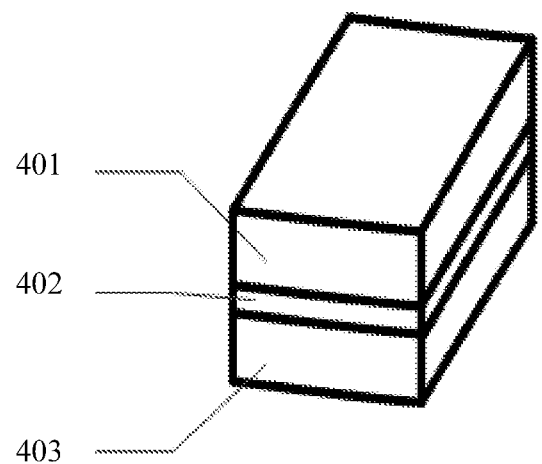
FIG. 4 is a schematic structural diagram of a reading unit according to an embodiment of the present disclosure.

The reading unit 204 includes a free layer 401, a pinning layer 402, and an isolation layer 403 (as shown in FIG. 4) disposed between the free layer 401 and the pinning layer 402. The pinning layer 402 has a fixed magnetic field direction, and the magnetic field direction does not change under impact of an external magnetic field. A magnetic field direction of the free layer 401 is a changeable magnetic field direction, and the magnetic field direction may be affected by an external magnetic field. When the magnetic field direction of the free layer 401 is consistent with that of the pinning layer 402, the magnetoresistive sensor presents a low resistance state, and a significant bit read in this case is "0". When the magnetic field direction of the free layer 401 is different from that of the pinning layer 402, the magnetoresistive sensor presents a high resistance state, and a significant bit read in this case is "1".

Based on the reading principle of the foregoing reading unit 204, the free layer 401 in the reading unit 204 is affected by magnetic fields in the first magnetic region 202a and the second magnetic region 202b, and a magnetic resistance state of the reading unit 204 is changed. Information written to the first magnetic region 202a and the second magnetic region 202b can be read according to such a magnetic resistance state, that is, "00", "01", "10", or "11" written to the magnetic domain 202 can be read.

The foregoing reading manner may be that the single reading unit 204 completes reading of information in the two magnetic regions, and in this reading manner, reading may be completed in the magnetic regions one by one.

Figure 5:
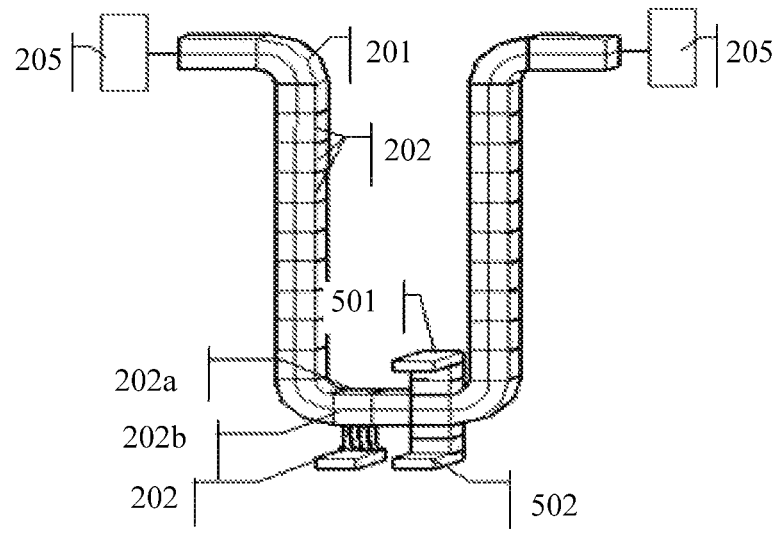
FIG. 5 is a schematic structural diagram of another information storage apparatus according to an embodiment of the present disclosure.

In this embodiment of the present disclosure, to further increase a reading speed of the reading unit 204, the reading unit 204 includes a first reading component 501 and a second reading component 502 (as shown in FIG. 5). In FIG. 5, the first reading component 501 is disposed on a surface of the first magnetic region 202a, and the second reading component 502 is disposed on a surface of the second magnetic region 202b. In this embodiment of the present disclosure, the first magnetic region 202a and the second magnetic region 202b have an overlapping surface, and the first reading component 501 and the second reading component 502 should not be disposed on the overlapping surface.

The first reading component 501 may be disposed on any surface of the first magnetic region 202a, and the second reading component 502 may be disposed on any surface of the second magnetic region 202b. FIG. 5 shows merely a symmetric disposition of the first reading component 501 and the second reading component 502 relative to the magnetic track 201, which does not indicate that it can only be the structure in FIG. 5.

Figure 6:
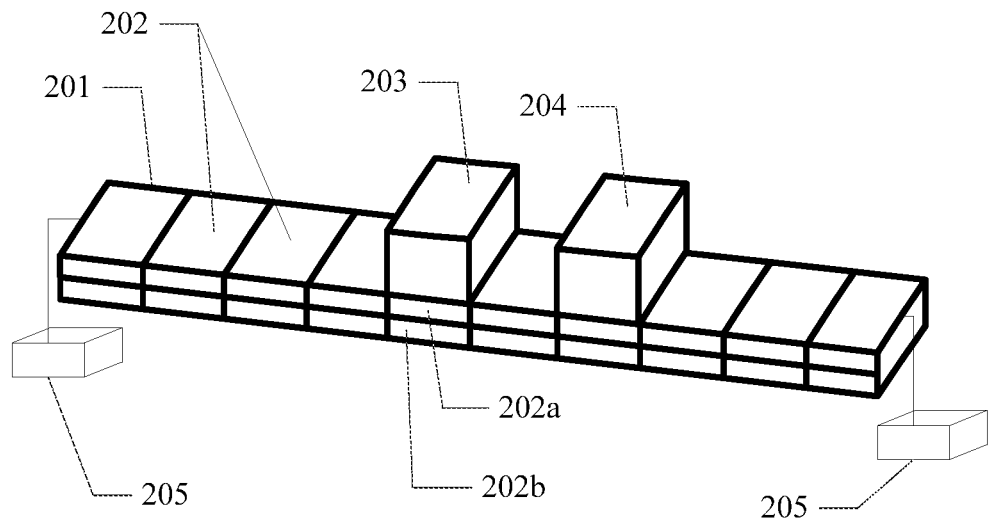
FIG. 6 is a schematic structural diagram of another magnetic track of an information storage apparatus according to an embodiment of the present disclosure.

In addition, it should be noted that a magnetic track 201 in both FIG. 4 and FIG. 5 is in a U-shaped structure, and in this embodiment of the present disclosure, the magnetic track 201 may also be a linear structure, which is further shown in FIG. 6.

This embodiment of the present disclosure provides the information storage apparatus, and the apparatus includes a magnetic track, where the magnetic track includes multiple magnetic domains, and each magnetic domain includes a first magnetic region and a second magnetic region, a writing unit, disposed on the magnetic track, where information is written to a first magnetic region and a second magnetic region of each magnetic domain by the writing unit, and a reading unit, disposed on the magnetic track, where the information written to the first magnetic region and the second magnetic region is read by the reading unit. That is, in this embodiment of the present disclosure, the magnetic track can store 2-bit information, for example, significant bit information "01", or "10", or "11", or "00" can be stored or read in one magnetic domain. Therefore, two pieces of valid information is written to one magnetic domain of the magnetic track, which increases storage density of the magnetic track, and expands a storage capacity of the storage apparatus.

Further, the writing unit of the information storage apparatus in this embodiment of the present disclosure can adjust an induced magnetic field generated by the writing unit in order to write different information to the first magnetic region and the second magnetic region using a changed induced magnetic field, thereby implementing efficient storage of different information.

Embodiment 2

Figure 7:
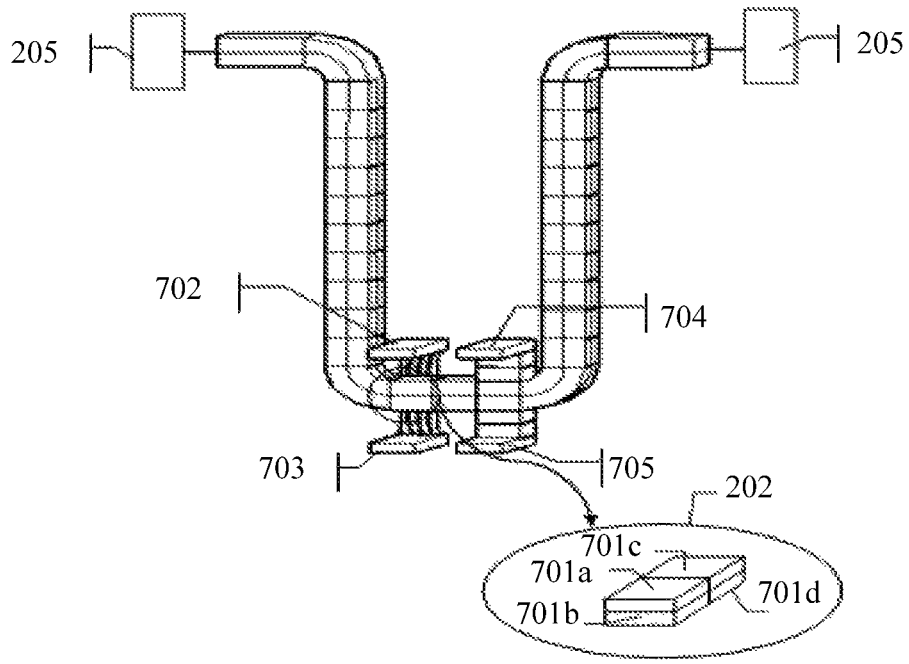
FIG. 7 is a schematic structural diagram of another information storage apparatus according to an embodiment of the present disclosure.

Embodiment 1 describes a case in which one magnetic domain 202 may be divided into two magnetic regions, and this embodiment of the present disclosure further includes a case in which one magnetic domain 202 is divided into multiple magnetic regions, for example, one magnetic domain 202 may be divided into four magnetic regions. The following uses a case in which one magnetic domain 202 is divided into four magnetic regions for description, that is, in FIG. 7, one magnetic domain is divided into four magnetic regions a first magnetic region 701a, a second magnetic region 701b, a third magnetic region 701c, and a fourth magnetic region 701d. In the four magnetic regions, it may be that each magnetic region is made of a different material. Certainly, it may also be that two magnetic regions are made of a same material, and the other two magnetic regions are made of another same material. In brief, the first magnetic region 701a and the third magnetic region 701c have a same magnetization threshold, and the second magnetic region 702b and the fourth magnetic region 701d has a same magnetization threshold.

On the basis of a fact that the magnetic domain 202 is divided into four magnetic regions, information is separately written by a writing unit to the four magnetic regions, for example, significant bits "00", "01", "10", or "11" may be written by the writing unit to the first magnetic region 701a and the second magnetic region 701b, where a manner in which the writing unit writes information to the first magnetic region 701a and the second magnetic region 701b is identical to a writing manner in Embodiment 1, and details are not described herein again. At the same time, significant bits "00", "01", "10", or "11" may further be written to the third magnetic region 701c and the fourth magnetic region 701d, where an information writing manner herein is identical to the manner in which information is written to the first magnetic region 701a and the second magnetic region 701b, and details are not described herein again. Certainly, to ensure accuracy of information writing herein, the writing unit may include two writing components, of which one writing component 702 is configured to write information to the first magnetic region 701a and the second magnetic region 701b, and the other writing component 703 is configured to write information to the third magnetic region 701c and the fourth magnetic region 701d, where an information writing manner thereof is already described in Embodiment 1, and details are not described herein again.

After information is written to the foregoing four magnetic regions, a reading unit in the apparatus reads the information written to the magnetic regions. Certainly, after the magnetic domain 202 is divided into four magnetic regions, the reading unit includes at least two reading components, where one reading component 704 is configured to read information written to the first magnetic region 701a and the second magnetic region 701b, and the other reading component 705 is configured to read information written to the third magnetic region 701c and the fourth magnetic region 701d, where an information reading manner thereof is already described in detail in Embodiment 1.

In addition, in this embodiment of the present disclosure, the reading unit may further include four reading components, and each reading component is responsible for reading information written to one magnetic region. In this way, it can be ensured that information in each magnetic region can be read out fast and accurately. A position relationship between a reading component and a magnetic region and a manner of reading information in a magnetic region are already described in Embodiment 1, and details are not described herein again.

Using Embodiment 1 and Embodiment 2, it can be illustrated that one magnetic domain of a magnetic track in this embodiment of the present disclosure may be divided into multiple magnetic regions, for example, may be divided into two magnetic regions or four magnetic regions. Certainly, based on the idea of this embodiment of the present disclosure, one magnetic domain may also be divided into three magnetic regions, or five or six magnetic regions, where a specific magnetic region division manner may be adjusted according to a requirement. Then, information is written to all divided magnetic regions, and in this way, a storage capacity of information in a magnetic domain is expanded substantially, which increases a utilization rate of the magnetic domain.

Embodiment 3

Figure 8:
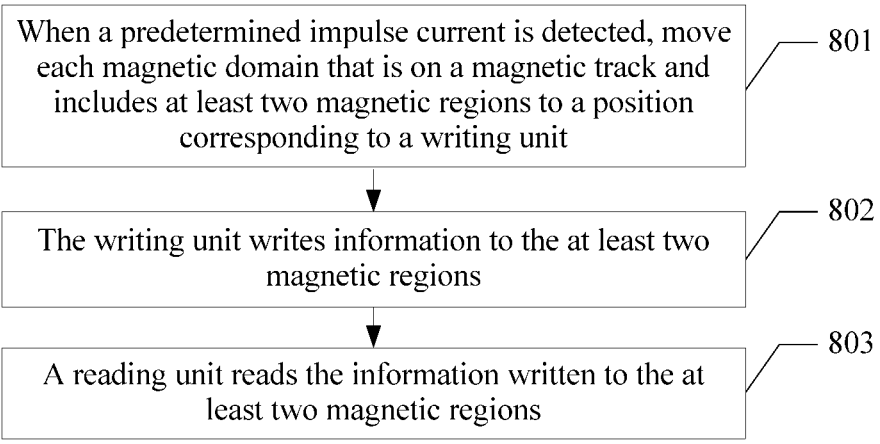
FIG. 8 is a flowchart of an information storage method according to an embodiment of the present disclosure.

Corresponding to an information storage apparatus in an embodiment of the present disclosure, this embodiment of the present disclosure further provides an information storage method. FIG. 8 shows a flowchart of an information storage method in an embodiment of the present disclosure. The method includes the following steps.

Step 801: When a predetermined impulse current is detected, move each magnetic domain that is on a magnetic track and includes at least two magnetic regions to a position corresponding to a writing unit.

Step 802: The writing unit writes information to the at least two magnetic regions.

Step 803: A reading unit reads information written to the at least two magnetic regions.

First of all, the information storage method in this embodiment of the present disclosure is applied to a storage apparatus, where the storage apparatus includes a magnetic track that stores information, a writing unit that writes information, and a reading unit that reads information. The magnetic track includes multiple magnetic domains, and each magnetic domain is divided into at least two different magnetic regions. Under an action of the predetermined impulse current, a magnetic domain wall between a magnetic domain and a neighboring magnetic domain moves, which causes the magnetic domain to move along the magnetic track.

Therefore, the magnetic domain can be moved to a position corresponding to the writing unit using the predetermined impulse current, and then, the writing unit generates an induced magnetic field to change a magnetic field direction of a first magnetic region and a second magnetic region in at least two different magnetic regions. Because the first magnetic region and the second magnetic region are made of different materials, the first magnetic region and the second magnetic region have different magnetization thresholds, where the magnetization threshold is minimum external magnetic field strength for changing a magnetic field direction of a magnetic region.

Because a magnetization threshold of the first magnetic region is different from that of the second magnetic region, a magnetic field direction of a magnetic region can be changed using a different induced magnetic field generated by the writing unit such that information is written to the magnetic region. A specific manner is as follows.

First of all, in an initial state, a magnetic field direction of the first magnetic region is the same as that of the second magnetic region. When there is no impact of an external magnetic field, information written to the first magnetic region is "0", and information written to the second magnetic region is also "0", that is, in a condition that the writing unit does not apply an external magnetic field to the magnetic domain, information written to the magnetic domain that includes the first magnetic region and the second magnetic region is "00".

When the writing unit needs to write "10" to the magnetic domain, the writing unit generates a first induced magnetic field and changes a magnetic field direction of the first magnetic region using the first induced magnetic field in order to write information to the first magnetic region, where magnetic field strength of the first induced magnetic field is greater than the magnetization threshold of the first magnetic region and is less than the magnetization threshold of the second magnetic region, that is, the writing unit changes only the magnetic field direction of the first magnetic region in order to complete writing of "10".

When the writing unit needs to write "11" to the magnetic domain, the writing unit generates a second induced magnetic field and changes a magnetic field direction of the first magnetic region and the second magnetic region using the second induced magnetic field in order to write information to the first magnetic region and the second magnetic region, where magnetic field strength of the second induced magnetic field is greater than the magnetization threshold of the first magnetic region and the second magnetic region.

When the writing unit needs to write "01" to the magnetic domain, the writing unit successively generates a second induced magnetic field and a first induced magnetic field, changes the magnetic field directions of the first magnetic region and the second magnetic region using the second induced magnetic field in order to write information to the second magnetic region, and changes the magnetic field direction of the first magnetic region again using the first induced magnetic field in order to write information to the first magnetic region.

This embodiment of the present disclosure provides the information storage apparatus and method, and the apparatus includes: a magnetic track, where the magnetic track includes multiple magnetic domains, and each magnetic domain is divided into at least two magnetic regions, a writing unit, disposed on the magnetic track, where information is written by the writing unit to the magnetic domain that includes the at least two magnetic regions, and a reading unit, disposed on the magnetic track, where the information written to the at least two magnetic regions of each magnetic domain is read by the reading unit, that is, at least 2-bit information can be stored on the magnetic track in the embodiments of the present disclosure. Therefore, multiple pieces of valid information are written to one magnetic domain of the magnetic track, which increases storage density of the magnetic track, and expands a storage capacity of the storage apparatus.

Further, the writing unit of the information storage apparatus in this embodiment of the present disclosure can adjust an induced magnetic field generated by the writing unit in order to write different information to a divided magnetic region using a changed induced magnetic field, thereby implementing efficient storage of different information.

The present disclosure is described with reference to the flowcharts and/or block diagrams of the method, the device (system), and the computer program product according to the embodiments of the present disclosure. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine such that the instructions executed by a computer or a processor of any other programmable data processing device generate an apparatus for implementing a specific function in one or more processes in the flowcharts and/or in one or more blocks in the block diagrams.

These computer program instructions may also be stored in a computer readable memory that can instruct the computer or any other programmable data processing device to work in a specific manner such that the instructions stored in the computer readable memory generate an artifact that includes an instruction apparatus. The instruction apparatus implements a specific function in one or more processes in the flowcharts and/or in one or more blocks in the block diagrams.

These computer program instructions may also be loaded onto a computer or another programmable data processing device such that a series of operations and steps are performed on the computer or another programmable device, thereby generating computer-implemented processing. Therefore, the instructions executed on the computer or the other programmable device provide steps for implementing a specific function in one or more processes in the flowcharts and/or in one or more blocks in the block diagrams.

Although some exemplary embodiments of the present disclosure have been described, persons skilled in the art can make changes and modifications to these embodiments once they learn the basic inventive concept. Therefore, the following claims are intended to be construed as to cover the exemplary embodiments and all changes and modifications falling within the scope of the present disclosure.

Obviously, a person skilled in the art can make various modifications and variations to the present disclosure without departing from the spirit and scope of the present disclosure. The present disclosure is intended to cover these modifications and variations provided that they fall within the scope of protection defined by the following claims and their equivalent technologies.

What is claimed is:

1. An information storage apparatus, comprising:
   a magnetic track comprising a plurality of magnetic domains, wherein each of the plurality of magnetic domains is divided into at least two magnetic regions wherein the at least two magnetic regions are made of different materials;
   a writer disposed on the magnetic track and configured to write information to the at least two magnetic regions of each magnetic domain; and
   a reader disposed on the magnetic track and configured to read the information written to the at least two magnetic regions of each magnetic domain.

2. The apparatus according to claim 1, wherein all of the at least two magnetic regions of each magnetic domain have a same magnetic field direction when no information is written in.

3. The apparatus according to claim 1, wherein all of the at least two magnetic regions of each magnetic domain are made of materials with different magnetization thresholds, and wherein the magnetization threshold is a minimum external magnetic field strength for changing a magnetic field direction of a magnetic region.

4. The apparatus according to claim 3, wherein the writer is configured to:
   generate a first induced magnetic field; and
   change a magnetic field direction of a first magnetic region in the at least two magnetic regions using the first induced magnetic field in order to write information to the first magnetic region, wherein a magnetic field strength of the first induced magnetic field is greater than a magnetization threshold of the first magnetic region.

5. The apparatus according to claim 3, wherein the writer is further configured to:
   generate a first induced magnetic field $P_1$; and
   change a magnetic field direction of a first magnetic region and a second magnetic region in the at least two magnetic regions using the first induced magnetic field $P_1$ in order to write information to the first magnetic region and the second magnetic region, wherein a magnetic field strength of the first induced magnetic field $P_1$ is greater than a magnetization threshold $K_1$ of the first magnetic region and a magnetization threshold $K_2$ of the second magnetic region.

6. The apparatus according to claim 3, wherein the writer is further configured to:
   successively generate a second induced magnetic field $P_2$ and a first induced magnetic field $P_1$;
   change a magnetic field direction of a first magnetic region and a second magnetic region in the at least two magnetic regions using the second induced magnetic field $P_2$ in order to write information that is to be written to the second magnetic region to the second magnetic region; and
   change the magnetic field direction of the first magnetic region again using the first induced magnetic field $P_1$ in order to write information that is to be written to the first magnetic region to the first magnetic region, wherein a magnetic field strength of the second induced magnetic field $P_2$ is greater than a magnetic field strength of the first induced magnetic field $P_1$.

7. The apparatus according to claim 1, wherein the writer comprises at least two writing components, wherein a first writing component in the at least two writing components is disposed on a surface of a first magnetic region in the at least two magnetic regions, wherein a second writing component in the at least two writing components is disposed on a surface of a second magnetic region in the at least two magnetic regions, wherein the first writing component is configured to write information to the first magnetic region, and wherein the second writing component is configured to write information to the second magnetic region.

8. The apparatus according to claim 1, wherein the reader comprises at least two reading components, wherein a first reading component in the at least two reading components is disposed on a surface of a first magnetic region in the at least two magnetic regions, wherein a second reading component in the at least two reading components is disposed on a surface of a second magnetic region in the at least two magnetic regions, wherein information written to the first magnetic region is read by the first reading component, and wherein the information written to the second magnetic region is read by the second reading component.

9. The apparatus according to claim 1, further comprising a driver connected to the magnetic track and configured to input an impulse current to the magnetic track to drive each one of the at least two magnetic regions of each magnetic domain to move in a same direction.

10. An information storage method, comprising:
moving each magnetic domain that is on a magnetic track and comprises at least two magnetic regions to a position corresponding to a writer when a predetermined impulse current is detected, wherein all of the at least two magnetic regions have different magnetization thresholds, and wherein the magnetization threshold is a minimum external magnetic field strength for changing a magnetic field direction of a magnetic region;
writing, by the writer, information to the at least two magnetic regions of each magnetic domain; and
reading, by a reader, the information written to the at least two magnetic regions.

11. The method according to claim 10, wherein writing, by the writer, information to the at least two magnetic regions of each magnetic domain comprises changing a magnetic field direction of a first magnetic region in the at least two magnetic regions using a first induced magnetic field generated by the writer in order to write information to the first magnetic region, wherein a magnetic field strength of the first induced magnetic field is greater than a magnetization threshold of the first magnetic region.

12. The method according to claim 10, wherein writing, by the writer, information to the at least two magnetic regions of each magnetic domain comprises changing a magnetic field direction of a first magnetic region and a second magnetic region in the at least two magnetic regions using a second induced magnetic field generated by the writer in order to write information to the first magnetic region and the second magnetic region, wherein a magnetic field strength of the second induced magnetic field is greater than a magnetization threshold of the first magnetic region and a magnetization threshold of the second magnetic region.

13. The method according to claim 10, wherein writing, by the writer, information to the at least two magnetic regions of each magnetic domain comprises:
successively generating, by the writer, a second induced magnetic field and a first induced magnetic field;
changing a magnetic field direction of a first magnetic region and a second magnetic region using the second induced magnetic field in order to write information that is to be written to the second magnetic region to the second magnetic region; and
changing the magnetic field direction of the first magnetic region again using the first induced magnetic field in order to write information that is to be written to the first magnetic region to the first magnetic region, wherein a magnetic field strength of the second induced magnetic field is greater than a magnetic field strength of the first induced magnetic field.

14. The method according to claim 10, wherein reading, by the reader, the information written to the at least two magnetic regions comprises:
reading, by a first reader in the reader, information written to a first magnetic region in the at least two magnetic regions of each magnetic domain; and
reading, by a second reader in the reader, information written to a second magnetic region in the at least two magnetic regions of each magnetic domain.

* * * * *